United States Patent
Haba

(10) Patent No.: US 10,347,582 B2
(45) Date of Patent: *Jul. 9, 2019

(54) EMBEDDED VIALESS BRIDGES

(71) Applicant: Invensas Corporation, San Jose, CA (US)

(72) Inventor: Belgacem Haba, Saratoga, CA (US)

(73) Assignee: Invensas Corporation, San Jose, CA (US)

(*) Notice: Subject to any disclaimer, the term of this patent is extended or adjusted under 35 U.S.C. 154(b) by 2 days.

This patent is subject to a terminal disclaimer.

(21) Appl. No.: 16/136,635

(22) Filed: Sep. 20, 2018

(65) Prior Publication Data

US 2019/0019754 A1    Jan. 17, 2019

Related U.S. Application Data

(63) Continuation of application No. 15/845,333, filed on Dec. 18, 2017, now Pat. No. 10,083,909, which is a
(Continued)

(51) Int. Cl.
*H01L 23/538* (2006.01)
*H01L 21/48* (2006.01)
(Continued)

(52) U.S. Cl.
CPC ........ *H01L 23/5381* (2013.01); *H01L 21/486* (2013.01); *H01L 21/4853* (2013.01);
(Continued)

(58) Field of Classification Search
CPC ............ H01L 23/5381; H01L 21/4853; H01L 21/486; H01L 23/5384; H01L 23/5386
(Continued)

(56) References Cited

U.S. PATENT DOCUMENTS 4,624,896 A    11/1986   Watanabe et al.
5,300,163 A     4/1994   Ohtaki
(Continued)

FOREIGN PATENT DOCUMENTS

EP    1 688 995 A1    8/2006

OTHER PUBLICATIONS

B-Stage Epoxy, Epoxy Technology Inc., 2012, 2 pages.
(Continued)

*Primary Examiner* — Sherman Ng

(57) ABSTRACT

Embedded vialess bridges are provided. In an implementation, discrete pieces containing numerous conduction lines or wires in a 3-dimensional bridge piece are embedded where needed in a main substrate to provide dense arrays of signal, power, and electrical ground wires below the surface of the main substrate. Vertical conductive risers to reach the surface plane of the main substrate are also included in the discrete piece, for connecting to dies on the surface of the substrate and thereby interconnecting the dies to each other through the dense array of wires in the discrete piece. The discrete piece to be embedded may have parallel planes of conductors at regular intervals within itself, and thus may present a working surface homogeneously covered with the ends of vertical conductors available to connect surface components to each other and to ground and power at many places along the embedded piece.

20 Claims, 6 Drawing Sheets

Related U.S. Application Data continuation of application No. 15/354,061, filed on Nov. 17, 2016, now Pat. No. 9,852,994.

(60) Provisional application No. 62/267,273, filed on Dec. 14, 2015.

(51) Int. Cl.
    *H01L 25/065* (2006.01)
    *H01L 23/00* (2006.01)

(52) U.S. Cl.
    CPC ...... *H01L 23/5383* (2013.01); *H01L 23/5384* (2013.01); *H01L 23/5386* (2013.01); *H01L 24/16* (2013.01); *H01L 24/81* (2013.01); *H01L 25/0655* (2013.01); *H01L 2224/16225* (2013.01); *H01L 2224/16227* (2013.01); *H01L 2224/16235* (2013.01); *H01L 2224/81192* (2013.01); *H01L 2924/15159* (2013.01); *H01L 2924/15192* (2013.01); *H01L 2924/15311* (2013.01); *H01L 2924/15313* (2013.01)

(58) Field of Classification Search
    USPC .......................... 174/255; 361/761, 783, 809
    See application file for complete search history.

(56) References Cited

U.S. PATENT DOCUMENTS

| | | |
|---|---|---|
| 5,953,816 A | 9/1999 | Pai et al. |
| 6,555,920 B2 | 4/2003 | Chee-Yee et al. |
| 6,943,108 B2 | 9/2005 | Farooq et al. |
| 7,047,637 B2 | 5/2006 | deRochemont et al. |
| 7,339,798 B2 | 3/2008 | Chakravorty |
| 7,402,901 B2 | 7/2008 | Hatano et al. |
| 7,504,271 B2 | 3/2009 | Palanduz |
| 7,663,206 B2 | 2/2010 | Lee |
| 7,675,160 B2 | 3/2010 | Dattaguru et al. |
| 7,833,370 B2 | 11/2010 | Kawamura et al. |
| 8,064,224 B2 | 11/2011 | Mahajan et al. |
| 8,274,149 B2 | 9/2012 | Chang et al. |
| 8,274,165 B2 | 9/2012 | Sasaki et al. |
| 8,435,373 B2 | 5/2013 | Slafer |
| 8,633,858 B2 | 1/2014 | Nair et al. |
| 8,686,548 B2 | 4/2014 | Arai |
| 8,723,332 B2 | 5/2014 | McElrea et al. |
| 8,901,748 B2 | 12/2014 | Manusharow et al. |
| 8,946,900 B2 | 2/2015 | Qian et al. |
| 8,988,895 B2 | 3/2015 | Mohammed et al. |
| 9,119,313 B2 | 4/2015 | Zhang et al. |
| 9,070,674 B2 | 6/2015 | Gallegos et al. |
| 9,111,902 B2 | 8/2015 | Savastiouk et al. |
| 9,147,663 B2 | 9/2015 | Liu et al. |
| 9,236,366 B2 | 1/2016 | Roy et al. |
| 9,312,175 B2 | 4/2016 | Haba et al. |
| 9,349,663 B2 | 5/2016 | Chen et al. |
| 9,368,425 B2 | 6/2016 | Graf et al. |
| 9,368,450 B1 | 6/2016 | Gu et al. |
| 9,374,896 B2 | 6/2016 | Chen et al. |
| 9,406,532 B2 | 8/2016 | Haba et al. |
| 9,433,077 B2 | 8/2016 | Brunschwiler et al. |
| 9,508,636 B2 | 11/2016 | Zhang et al. |
| 9,633,872 B2 | 4/2017 | Chen et al. |
| 9,642,259 B2 | 5/2017 | Kim et al. |
| 9,713,264 B2 | 7/2017 | Rawlings et al. |
| 2004/0256715 A1 | 12/2004 | Seki |
| 2007/0004229 A1 | 1/2007 | Malajovich |
| 2009/0068790 A1 | 3/2009 | Caskey et al. |
| 2009/0244874 A1* | 10/2009 | Mahajan ............... H01L 24/16 361/809 |
| 2011/0148447 A1 | 6/2011 | Yoo et al. |
| 2016/0212862 A1 | 7/2016 | Rathbum |

OTHER PUBLICATIONS

Ceramic, http://en.wikipedia.org/wiki/Ceramic, retrieved on Jul. 25, 2014, 7 pages.

Ceramic Engineering, http://en.wikipedia.org/wiki/Ceramic_engineering, retrieved on Jul. 25, 2014, 18 pages.

Ceramic Materials, http://en.wikipedia.org/wiki/Ceramic_materials, retrieved on Jul. 25, 2014, 11 pages.

Haavind, B., "Big Push Coming on Two Routes to 3D," Solid State Technology, retrieved on Oct. 31, 2014 at http://electroiq.com/blog/2007/07/big-push-coming-on-two-routes-to-3D, 4 pages.

International Search Report and Written Opinion for PCT Application No. PCT/US2015/058861, dated Feb. 5, 2016, 11 pages.

International Search Report and Written Opinion for PCT Application No. PCT/US2016/038568, dated Oct. 11, 2016, 13 pages.

International Search Report and Written Opinion dated Mar. 15, 2017 for PCT Application No. PCT/US2016/064946, 9 pages.

Matijasevic, G., "Multilayer Circuitry on Metal Substrates," Electronics Cooling Magazine, Sep. 1, 2000, 9 pages.

Microcontact Printing, http://en.wikipedia.org/w/index.php?title=Microcontact_printing, retrieved on Aug. 5, 2014, 7 pages.

Orlovskaya et al., "Robust Design and Manufacturing of Ceramic Laminates with Controlled Thermal Residual Stresses for Enhanced Toughness," Journal of Materials Science, vol. 40, Issue 20, Oct. 2005, pp. 5483-5490.

Schwartz, E., "Roll to Roll Processing for Flexible Electronics," Cornell University, pp. 1-24, May 11, 2006.

Wright, S.L. et al., "Characterization of Micro-bump C4 Interconnects for Si-Carrier SOP Applications," Electronic Components and Technology Conference, 2006, pp. 633-640.

\* cited by examiner

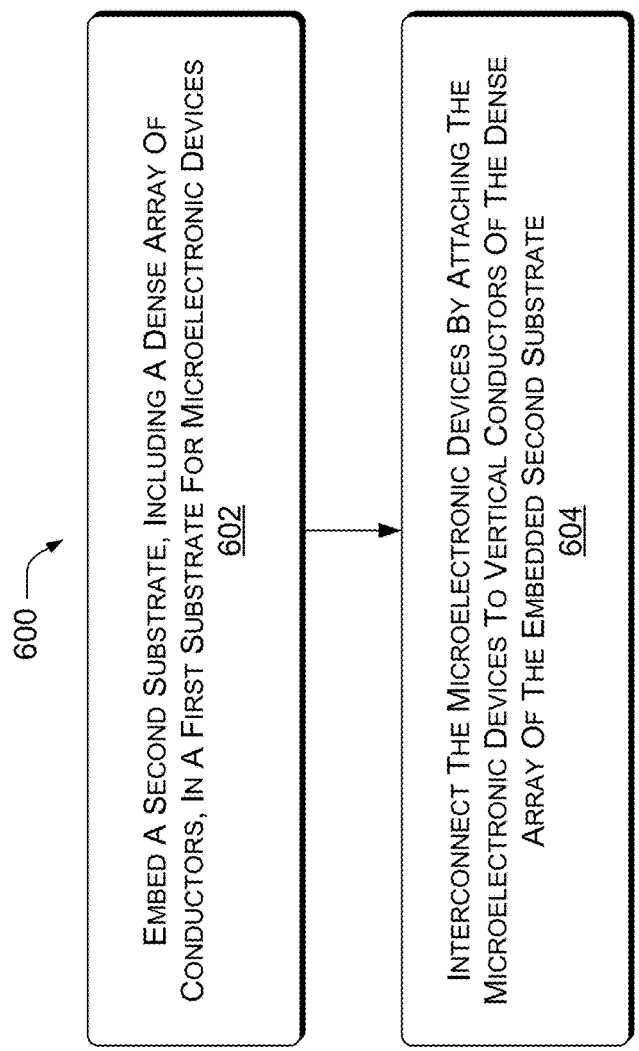

EMBEDDED VIALESS BRIDGES

RELATED APPLICATIONS

This continuation application claims the benefit of priority to U.S. patent application Ser. No. 15/845,333 to Haba, filed Dec. 18, 2017, now U.S. Pat. No. 10,083,909 issued Sep. 25, 2018, which in turn claims the benefit of priority to U.S. patent application Ser. No. 15/354,061 to Haba, filed Nov. 17, 2016, now U.S. Pat. No. 9,852,994 issued Dec. 26, 2017, which in turn claims the benefit of priority to U.S. Provisional Patent Application No. 62/267,273 to Haba, filed Dec. 14, 2015, all of these incorporated by reference herein in their entireties.

BACKGROUND

As microelectronic components become smaller, more wiring and more signal traces must be miniaturized to fit onto smaller and smaller surface-area footprints of a package substrate. This trend has resulted in very fine conduction lines and high density wiring on the surface of a conventional substrate. But signal fidelity can suffer when the traces are very fine. Interference and other degradation can also occur when the pitch between lines is very fine for high density interconnects on a surface plane. Besides a signal layer, power and electrical ground connections may also need to be implemented the same horizontal surface of the substrate. When this surface "real estate" of the substrate becomes crowded, there may be a theoretical limit to further concentrating the high conductor count on a given top surface or bottom surface of the substrate. Conventional miniaturization needed to achieve a high density of conductive traces on a given top or bottom surface area of the substrate is also expensive.

SUMMARY

This disclosure describes embedded vialess bridges. In an implementation, discrete pieces containing numerous conduction lines or wires in a 3-dimensional bridge piece are embedded where needed in a main substrate to provide dense arrays of signal, power, and electrical ground wires below the surface of the main substrate. Vertical conductive risers to reach the surface plane of the main substrate are also included in the discrete piece, for connecting to dies on the surface of the substrate and thereby interconnecting the dies to each other through the dense array of wires in the discrete piece. The discrete piece to be embedded may have parallel planes of conductors at regular intervals within itself, and thus may present a working surface homogeneously covered with the ends of vertical conductors available to connect surface components to each other and to ground and power at many places along the embedded piece.

This summary is not intended to identify key or essential features of the claimed subject matter, nor is it intended to be used as an aid in limiting the scope of the claimed subject matter.

BRIEF DESCRIPTION OF THE DRAWINGS

Certain embodiments of the disclosure will hereafter be described with reference to the accompanying drawings, wherein like reference numerals denote like elements. It should be understood, however, that the accompanying figures illustrate the various implementations described herein and are not meant to limit the scope of various technologies described herein.

FIG. 6 is a flow diagram of an example method of embedding a second substrate in a first substrate for microelectronic devices to provide a dense array of wide wires beneath a surface of the first substrate for interconnecting the microelectronic devices.

DETAILED DESCRIPTION

Figure 1:
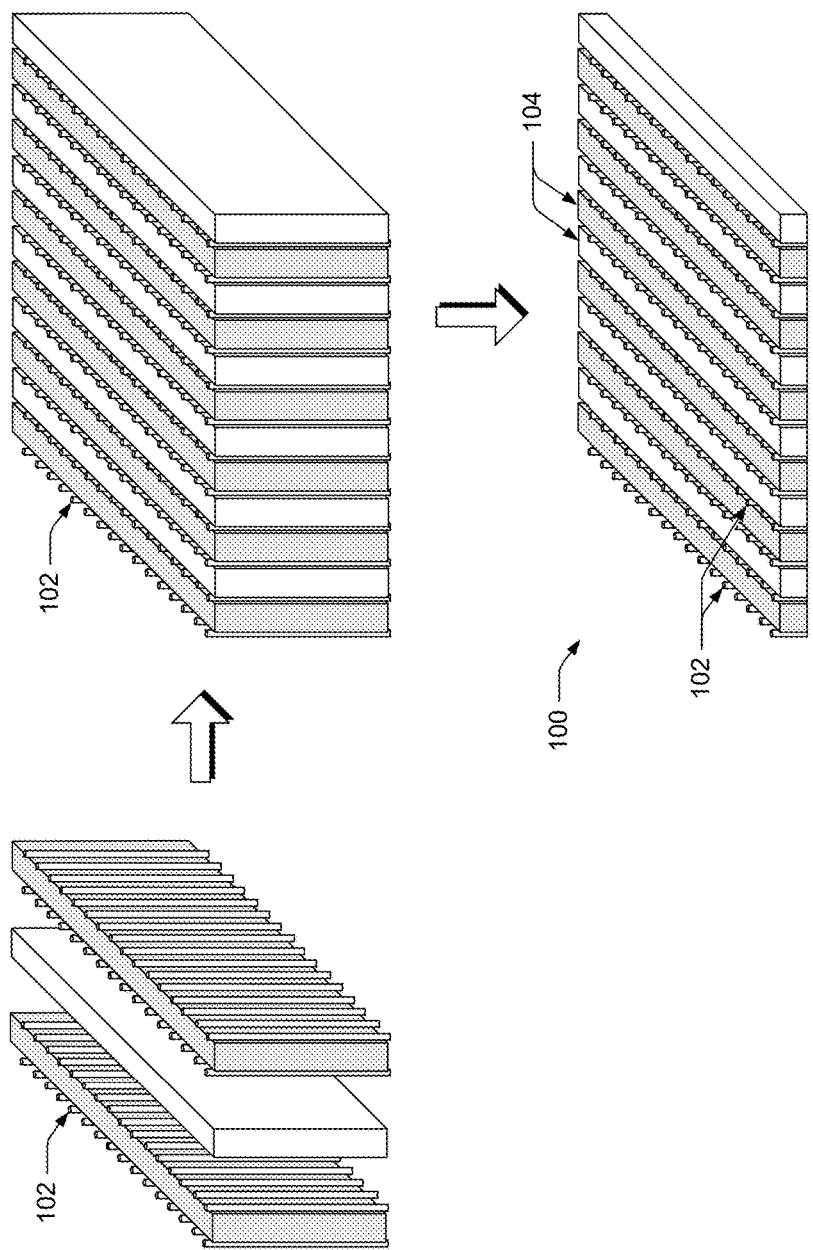
FIG. 1 is a diagram of an example vialess bridge piece, including an integral dense array of conductors for interconnecting microelectronic devices, embeddable as a second substrate in a main, first substrate.

This disclosure describes example embedded vialess bridges. In an implementation, discrete pieces containing numerous conduction lines or wires in a 3-dimensional bridge piece are embedded where needed in a main substrate to provide dense arrays of signal, power, and electrical ground wires below the surface of the main substrate. While the conduction lines in the discrete piece are embedded below the surface of the main substrate, vertical conductors or "risers" to reach the surface plane of the main substrate are also included in the discrete piece, e.g., for connecting to dies and their pads on the surface of the substrate and thereby interconnecting the dies to each other, through the dense array of wires in the discrete piece. The discrete piece to be embedded may have parallel planes of conductors at regular intervals within itself, and thus may present a working surface homogeneously covered with the ends of vertical conductors available to connect surface components to each other and to ground and power at many places along the embedded piece.

Inserting or embedding an example discrete piece, which connects dies to each other, solves the need for a very high density of interconnects without adopting the very fine line aspect required on the horizontal top surfaces of conventional substrates. The example embedded vialess bridges can provide 3D-ICs, for example, with an ability to place connections in a dense array that takes advantage of verticality, without the strict perimeter constraints imposed by conventional fine pitch or high density wire-bonded designs.

The dense array of conductors in the example discreet piece (hereinafter "second substrate" or "embedded substrate") is made integral with the discrete piece, or second substrate. Since this second substrate containing the conductors is embedded during formation of the main substrate ("first substrate"), there is no need to create vias, i.e., individual vertical holes in the main substrate made by drilling, for example. The creation of conventional vias is thus avoided by the example system of embedded vialess bridges described herein.

Since the embedded conductors of the embedded substrate can take advantage of depth, and are not confined to just the surface plane of the main substrate, the individual wires or traces in the embedded substrate piece can be much wider and/or thicker than would be possible for the very fine surface traces that conventionally connect dies. The wider traces in the example second substrate embedded below the surface of the main substrate provide more reliable operation, higher signal fidelity, higher current, voltage, and power carrying capacity than conventional fine traces and wire routing on the surface of conventional substrates. Moreover, the wider traces and wires of the embedded second substrate are less expensive to implement than conventional high density surface traces.

The second substrate, or discrete bridge piece, containing conduction lines to be embedded, can be made in many thicknesses, and likewise can be embedded at different depths, even within the same main substrate. For example, since the second substrate can be embedded at the time of manufacture, the second substrate and conduction lines can be created inside the core of the substrate, or as part of the core itself. On the other hand, in an implementation, a thin version of the second substrate containing conduction lines can be embedded in an outer layer of the substrate, even in an added layer such as an outer dielectric layer or other outer layer of the substrate.

The example embedded second substrate may have numerous vertical conduction risers to reach the surface plane of the main substrate. This can allow surface connection to a given embedded line at multiple surface points along extent of the line. Depending on construction of the embedded second substrate, there may be multiple vertical planes of vertical risers for signal, power, and electrical ground. In an implementation, this can enable connection to the desired embedded line at many places on the surface of the main substrate.

As a manufacturing benefit, the second substrate may be embedded without undue regard for careful surface tolerances. An example embedment of the second substrate may allow a part of the second substrate to protrude or "stick out" from the surface of the main substrate. Since only the vertical risers of the second substrate reach this surface plane of the main substrate, the surface of the substrate may be inexpensively lapped or polished without much regard for how thick of a layer of the embedded second substrate gets subtracted during polish. The vertical risers provide the same access to their embedded conduction lines regardless of the final disposition of the main substrate surface. This is to be contrasted with conventional practice, where lapping can peel, scratch or destroy surface traces. In the example system herein, the only conductors of the second substrate accessible at the surface plane of the main substrate are vertical risers that can be shortened by polishing them, without harm.

The second substrate with its integral electrical conductors may be embedded at an angle, such as a 90 degree angle, or other various angles with respect to the first substrate in order to replace the very fine conventional surface conductors and the fine-pitch routing of such conventional surface conductors.

The second substrate may be composed of printed-circuit-board (PCB) materials, glass, epoxy, composites, FR-4, plastics, polymers, glass-reinforced epoxy laminate sheets, woven fiberglass cloth with epoxy resin binder, and so forth. In an implementation, planes of parallel conductors are embedded in the second substrate, during its own manufacture.

Instead of very fine and very high density conventional wiring placed on top of, and parallel to, the surface of the substrate, the embedded second substrate, having planes of conductors rotated 90 degrees with respect to the surface of the main substrate, contains vertical conductors that take advantage of the depth of the embedment to provide desired wiring and interconnects with wider wires and robust parallel power and electrical ground plains. These robust vertical conductors can connect surface components with better conductors in the same or a smaller footprint than conventional layouts, thereby replacing conventional high density surface wiring and conventional finely spaced lines.

Since the embedded conductors can take advantage of the vertical dimension to have multiple planes of horizontal and vertical conductors beneath the surface of the main substrate, the embedded second substrate can make finer connections with better conductors and can bridge smaller components than conventional fine lines and high density wiring on a conventional substrate surface. Moreover, the example embedded substrates are significantly less expensive than conventional fine conduction lines, while providing higher density wiring connections.

FIG. 1 shows an example second substrate 100 with integral conductors 102. In an implementation, the second substrate, to be embedded with its integral conductors 102, may be composed of multiple layers, or plates 104 made of the selected substrate material, interposed with parallel planes of conductors 102 integral (and thereby vialess) with the substrate material.

In an implementation, an example of the embeddable second substrate 100 with integral conductors 102 may be made by arranging conductors parallel to each other on one or more flat surfaces of a dielectric material, insulation layer, insulator plate, or other suitable substrate material, stacking or alternating a plurality of such plates, bonding the plates with the interposed conductors to compile a laminated block that has planes of the parallel conductors built-in, and then dicing the laminated block at 90 degrees to the parallel conductors to form a substrate with vialess embedded vertical conductors for bridging components of microelectronic devices. In an implementation, each layer of the example second substrate 100 is a plate 104 with conductive traces 102 conducting though the plate 104.

Figure 2:
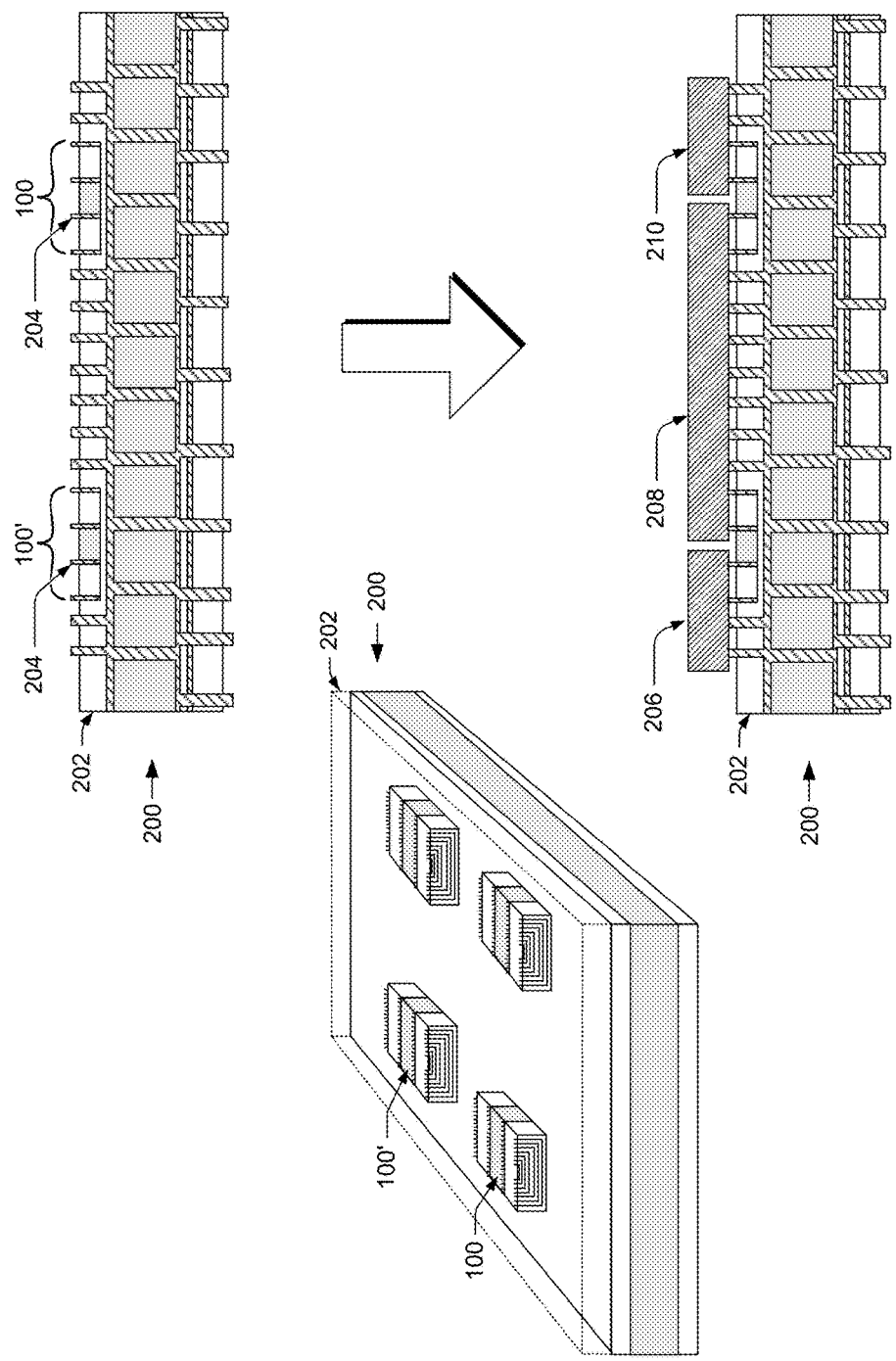
FIG. 2 is a diagram of the example second substrate and vialess bridge piece of FIG. 1, embedded in a first substrate to interconnect dies.

FIG. 2 shows an example embedment of embeddable second substrates 100 & 100' in a main substrate 200 of a microelectronics package. In this example, the second substrates 100 & 100' are embedded in a relatively shallow outer layer 202 of the main substrate 200. A second substrate 100 can be embedded much deeper, for example in the core of the substrate 200, or as part of the core itself. Vertical conductors 204 of the second substrates 100 & 100' provide electrical contacts or pads on the top surface of the main substrate 200. The second substrates 100 & 100' provide bridge connections between dies, such as dies 206 & 208, and dies 208 & 210 mounted on the surface of the main substrate 200. Each second substrate 100, or discrete piece, connects dies, such as dies 206 & 208, with each other with high density wiring below the surface of the main substrate.

Figure 3:
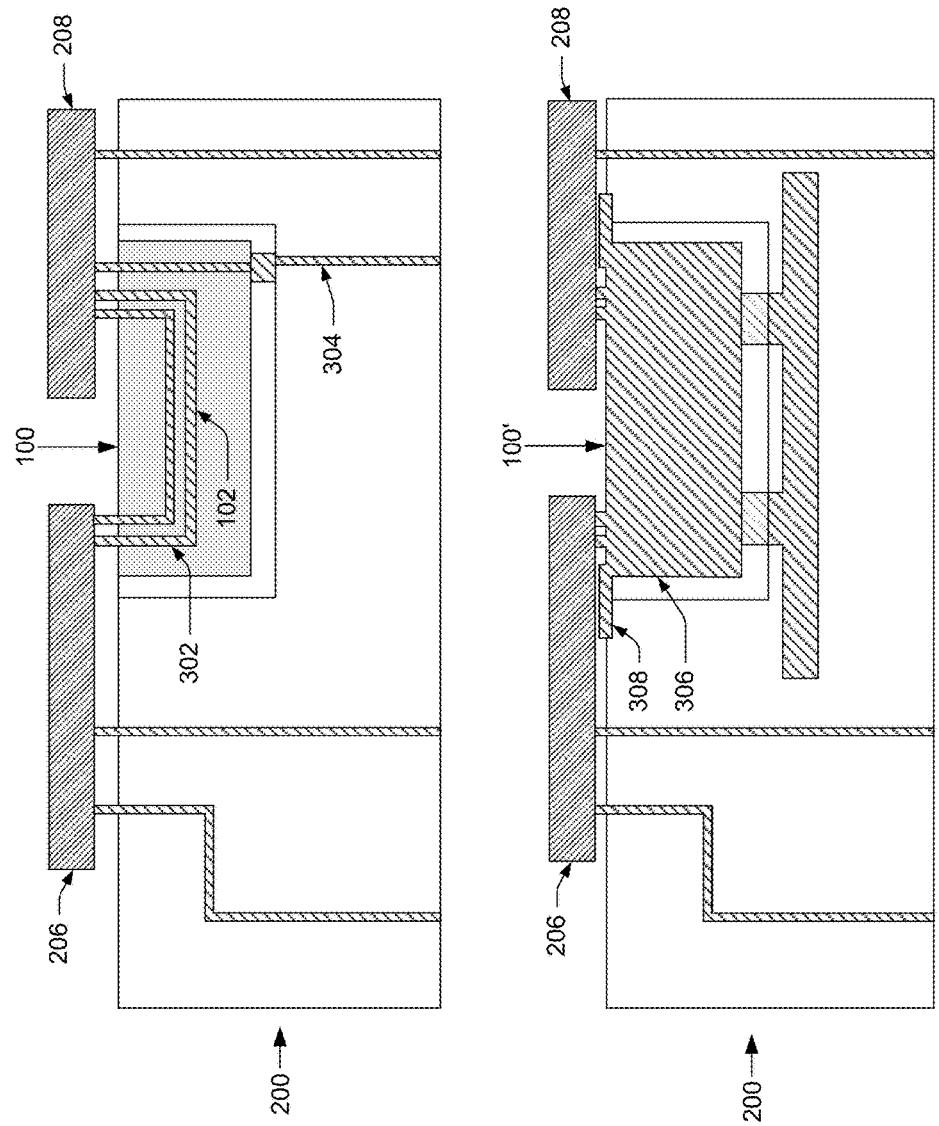
FIG. 3 is a diagram of an example signal layer and example power or ground layers provided by instances of the example second substrate.

FIG. 3 shows embedding of an example second substrate 100 with integral embedded conductors 102 to connect dies 206 & 208 on the surface of the main substrate 200. The embedded second substrate 100 may provide the high density conduction lines 102 or wires of a signal layer 302 connecting dies, e.g., 206 & 208. The embedded second substrate 100 may also be connected with conductors 304 in the main substrate 200, which in turn are in communication with the opposing side (e.g., bottom) of the main substrate 100. A given second substrate 100 may be selectively embedded only where needed to make interconnects on the main substrate 200.

An embedded second substrate 100' may also provide a power or an electrical ground layer 306, or both, to dies 206 & 208 and may connect to power and ground connectors 308 in general on the surface of the main substrate 200. A given embedded second substrate 100 with integral conductors 102 may also provide an electrical bus or high density electrical yoke beneath the surface of the main substrate 100. An embedded second substrate 100 may also replace or constitute part of a redistribution layer (RDL) or fan-in/fan-out area of a microelectronics package.

Figure 4:
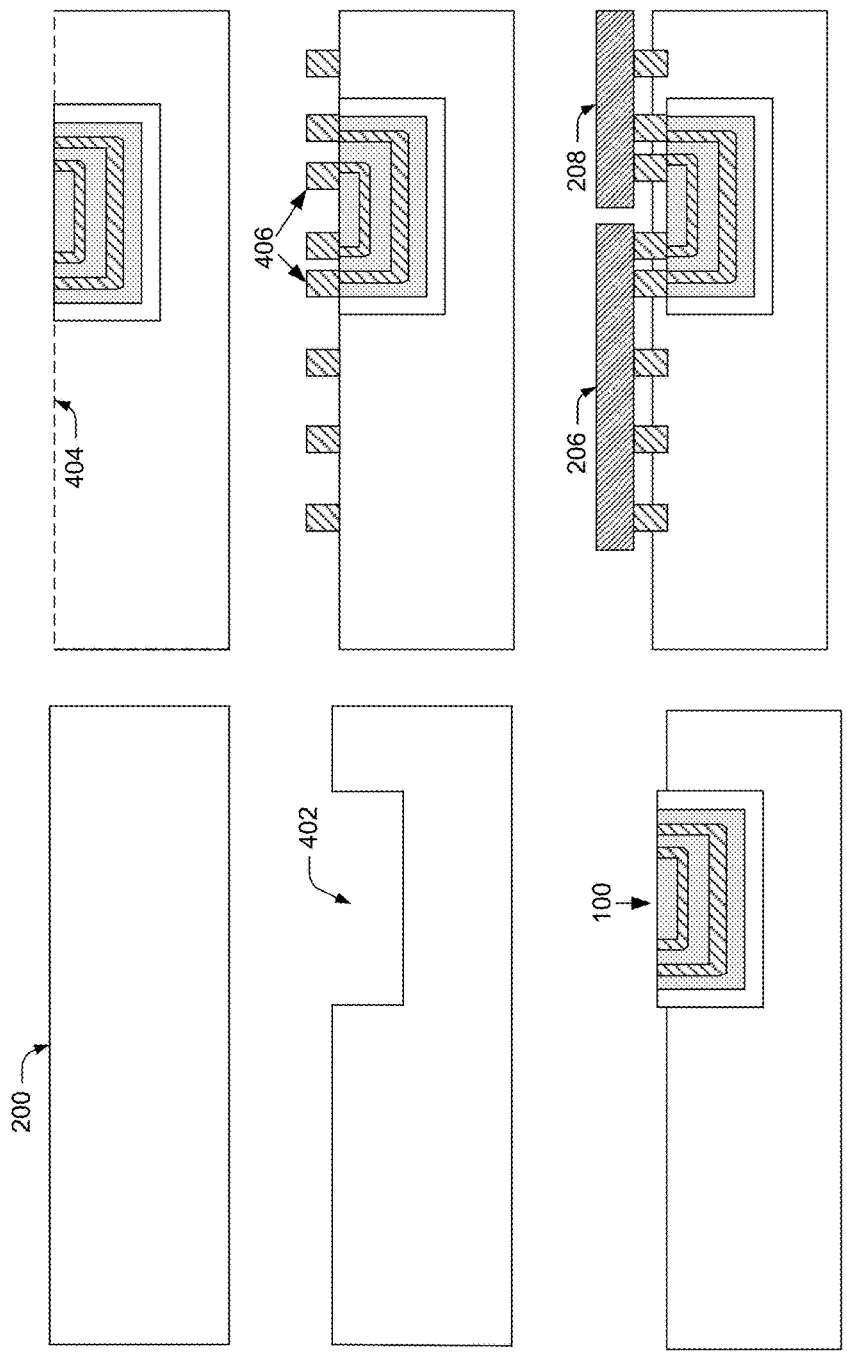
FIG. 4 is a diagram of manufacture stages for embedding the example second substrate, including the integral dense array of conductors, as a signal layer in the first substrate for microelectronic devices.

FIG. 4 shows example phases of embedding an example embeddable substrate 100 to provide a signal layer within a main substrate 200. A suitable substrate material is first selected for the main substrate 200. A displacement 402 of the main substrate 200 is designed into manufacture, to embed the embeddable second substrate 100. A surface plane of the main substrate 200 and the embedded second substrate 100 may be polished or lapped to achieve flatness 404, as described above. Conductive pads 406, balls, connectors, etc., may be added by soldering, for example, to the exposed ends of the vertical conductors 204 of the embedded second substrates 100, for connecting with dies 206 & 208.

Figure 5:
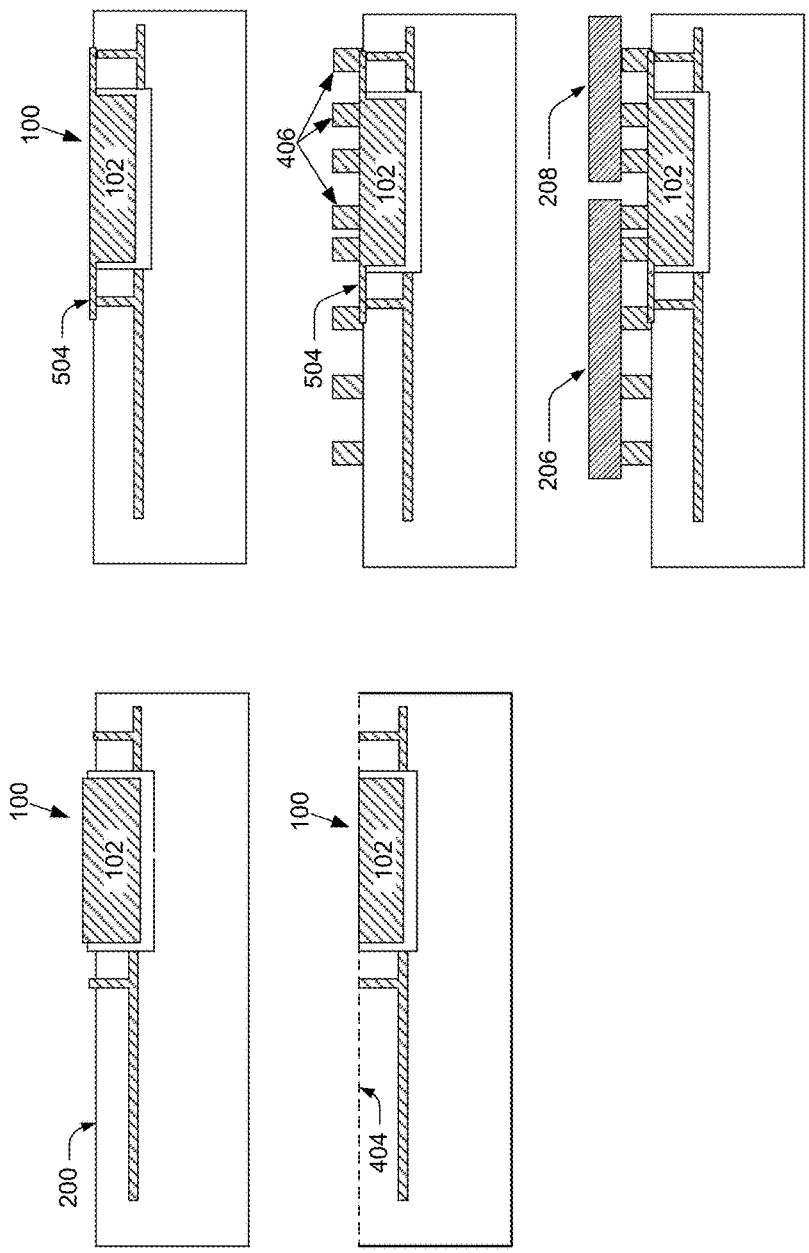
FIG. 5 is a diagram of manufacture stages for embedding the example second substrate, including the integral dense array of conductors, as a power or ground layer in the first substrate for microelectronic devices.

FIG. 5 shows example phases of embedding an example embeddable substrate 100 to provide a power or electrical ground layer, or both within a main substrate 200. In an implementation, the embeddable second substrate 100 is cut or formed, and adhesive may be used in one implementation to bond the embeddable substrate 100 to the main substrate 200. If the top of the embedded substrate 100 protrudes above the surface plane of the main substrate 200, then the entire surface may be lapped or polished for flatness 404. A power bus 504 or line (or a ground bus or line) may be connected to a conductor 102 of the embedded substrate 100. Conductive pads 406, balls, connectors, etc., may be added by soldering, for example, to the exposed power or ground bus 504, for connecting with dies 206 & 208.

Example Method

FIG. 6 shows an example method 600 of embedding a second substrate in a first substrate for microelectronic devices to provide a dense array of wide wires beneath a surface of the first substrate for interconnecting the microelectronic devices. In the flow diagram of FIG. 6, operations of the example method 600 are shown in individual blocks.

At block 602, a second substrate, including a dense array of conductors, is embedded in a first substrate for microelectronic devices.

At block 604, the microelectronic devices are interconnected by attaching the microelectronic devices to vertical conductors of the embedded second substrate, the vertical conductors in communication with the dense array of conductors in the embedded second substrate.

In the example method 600, the embedded second substrate may comprise electrical conductors integral with the embedded second substrate to provide a vialess embedded second substrate.

The example method 600 may further comprise embedding the second substrate inside a core of the first substrate or as part of the core of the first substrate during manufacture.

The example method 600 may further comprise embedding the second substrate superficially in an outer layer of the first substrate, or more deeply in the first substrate, e.g., inside a core of the first substrate or as part of the core of the first substrate.

The embedding may comprise applying an adhesive to bond the embedded second substrate including the dense array of conductors to the first substrate.

Embedding the second substrate in the first substrate may cause the second substrate to protrude above the surface plane of the first substrate; and the example method 600 may include lapping or polishing the second substrate and the first substrate to a flatness of the first substrate, wherein the vertical conductors remain accessible at variable depths of the lapping or the polishing.

The example method 600 may include integrating numerous wide wires in the second substrate to comprise the dense array of conductors, and embedding the second substrate in the first substrate to provide replacement of a very fine line aspect of surface traces of the first substrate.

The example method 600 may further comprise integrating numerous wide wires at various depths of the second substrate to provide the dense array of conductors.

Conductive pads or balls may be attached to the vertical conductors for connecting a die to the vertical conductors.

The example method 600 may include embedding the second substrate including the dense array of conductors in the first substrate to interconnect a top surface and a bottom surface of the first substrate.

The example method 600 may also include embedding multiple instances of the second substrate at different depths in the same first substrate to provide signal, power, and ground layers beneath a surface plane of the first substrate.

In the specification and appended claims: the terms "connect", "connection", "connected", "in connection with", and "connecting" are used to mean "in direct connection with" or "in connection with via one or more elements"; and the term "set" is used to mean "one element" or "more than one element". Further, the terms "couple", "coupling", "coupled", "coupled together", and "coupled with" are used to mean "directly coupled together" or "coupled together via one or more elements". As used herein, the terms "up" and "down", "upper" and "lower", "upwardly" and downwardly", "upstream" and "downstream"; "above" and "below"; and other like terms indicating relative positions above or below a given point or element are used in this description to more clearly describe some embodiments of the disclosure.

While the present disclosure has been disclosed with respect to a limited number of embodiments, those skilled in the art, having the benefit of this disclosure, will appreciate numerous modifications and variations there from. It is intended that the appended claims cover such modifications and variations as fall within the true spirit and scope of the disclosure.

The invention claimed is:

1. A vialess bridge, comprising:
   a bridge substrate of a nonconductive material bearing electrical conductors, the bridge substrate capable of being embedded in a surface layer or a surface coating of a main substrate;
   the electrical conductors comprising an array of signal, power, and ground wires; and
   parallel vertical layers in the substrate, each parallel vertical layer made of individual electrical conduits, each layer of conduits interleaved with a layer of the nonconductive material to form a laminate block providing conductors for coupling a first die to a second die.

2. The vialess bridge of claim 1, wherein the conductors for coupling a first die to a second die comprise horizontal conduits connecting first vertical conductors to second vertical conductors to enable surface-to-surface electrical connections on the main substrate using the array of the vialess bridge.

3. The vialess bridge of claim 1, further comprising a working surface containing surface portions of the vertical conductors.

4. The vialess bridge of claim 3, wherein signal, power, and ground connections are available at multiple locations and at regular intervals over the working surface.

5. The vialess bridge of claim 1, wherein the bridge substrate is applicable to a surface of the main substrate to provide the dense array of signal, power, and ground wires for interconnecting multiple dies on the surface of the main substrate.

6. The vialess bridge of claim 2, further comprising a working surface containing surface portions of the vertical conductors and wherein the horizontal conduits have a depth dimension relative to the working surface that is greater than a width dimension of the horizontal conduits relative to the working surface.

7. The vialess bridge of claim 2, further comprising a working surface containing surface portions of the vertical conductors, wherein at least some of the vertical conductors extend from the working surface to another surface of the bridge substrate opposite the working surface.

8. An assembly, comprising:
a first substrate with conductive traces at a first line aspect;
a second substrate embedded in the first substrate with conductive traces at a second line aspect finer than the first line aspect, the second line aspect of the second substrate providing a denser array of conductive lines than the first substrate; and
parallel vertical layers in the second substrate, each parallel vertical layer made of individual electrical conduits, each layer of conduits interleaved with a layer of the nonconductive material to form a laminate block providing vialess vertical conductors.

9. The assembly of claim 8, further comprising horizontal conduits between at least some of the vialess vertical conductors to enable point-to-point electrical connections on the first substrate of the circuit board using the denser array of the second substrate.

10. The assembly of claim 9, wherein the dense array of the second substrate bridge provides a socket for a 3D-IC die or package.

11. The circuit board of claim 9, wherein the dense array of the second substrate provides interconnects for a 3D-IC die or package.

12. The assembly of claim 9, wherein the dense array of the second substrate provides interconnects between multiple 3D-IC dies or packages.

13. The assembly of claim 8, further comprising a working surface on the second substrate homogenously covered with ends of the vialess vertical conductors.

14. The assembly of claim 13, wherein the working surface provides signal, power, or ground connections at multiple locations and at regular intervals over the surface area of the working surface.

15. The assembly of claim 8, wherein the second substrate is applicable to a surface of the first substrate of the circuit board to provide the dense array of signal, power, and ground wires for interconnecting multiple dies on the surface of the circuit board.

16. The assembly of claim 8, further comprising multiple instances of the second substrate embedded in the first substrate, to provide multiple areas of the dense array of conductive lines on the surface of the circuit board.

17. The assembly of claim 9, wherein the second substrate provides at least one signal conduction layer in one or more additional planes parallel to the plane of the surface, the at least one signal conduction layer comprising conductors at one or more vertical depths from the surface, a horizontal pitch of the conductors at the one or more vertical depths determined by thicknesses of the layers of nonconductive insulator material of the parallel vertical layers.

18. The assembly of claim 17, wherein the at least one signal conduction layer comprises wide conduction traces or wires in at least one vertical plane of the parallel vertical layers providing a higher signal fidelity, a higher current-carrying capacity, a higher voltage capacity, or a higher power-carrying capacity than traces or wire routing on the surface of the first substrate of the circuit board.

19. The assembly of claim 8, wherein the second substrate provides at least one power plane in a vertical plane or at least one ground plane in a vertical plane accessible to microelectronic devices on the surface of the circuit board.

20. The assembly of claim 8, wherein the second substrate provides a vialess vertical conductor from a first surface of the assembly to an opposing surface of the second substrate.

* * * * *